US012675627B2

(12) United States Patent
Lin et al.

(10) Patent No.: US 12,675,627 B2
(45) Date of Patent: Jul. 7, 2026

(54) PARASITIC RESISTANCE AND CAPACITANCE EXTRACTION METHODS AND NON-TRANSITORY COMPUTER-READABLE MEDIA THEREOF

(71) Applicant: TAIWAN SEMICONDUCTOR MANUFACTURING COMPANY LTD., Hsinchu (TW)

(72) Inventors: Chin-Shen Lin, Taipei City (TW); Wan-Yu Lo, Taoyuan County (TW); Kuo-Nan Yang, Hsinchu City (TW); Chung-Hsing Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1092 days.

(21) Appl. No.: 17/742,416

(22) Filed: May 12, 2022

(65) Prior Publication Data

US 2023/0367945 A1    Nov. 16, 2023

(51) Int. Cl.
G06F 30/367 (2020.01)
G06F 30/392 (2020.01)
G06F 119/10 (2020.01)

(52) U.S. Cl.
CPC .................................. G06F 30/392 (2020.01)

(58) Field of Classification Search
CPC .. G06F 30/392; G06F 2119/10; G06F 30/367; G06F 30/398
See application file for complete search history.

(56) References Cited

U.S. PATENT DOCUMENTS

| | | | | |
|---|---|---|---|---|
| 6,421,814 B1* | 7/2002 | Ho | .......................... | G06F 30/398 716/113 |
| 8,127,260 B1* | 2/2012 | Song | ...................... | G06F 30/392 716/108 |
| 2012/0185807 A1* | 7/2012 | Tsai | ...................... | G06F 30/398 716/52 |

* cited by examiner

*Primary Examiner* — Nghia M Doan
(74) *Attorney, Agent, or Firm* — WPAT LAW; Anthony King

(57) ABSTRACT

The present disclosure provides methods and a non-transitory computer readable media for resistance and capacitance (RC) extraction. The method comprises: receiving an electronic layout; selecting a two-dimensional (2D) conductive element from the electronic layout, wherein an aspect ratio of the 2D conductive element is lower than a predetermined threshold; partitioning the 2D conductive element into a plurality of polygons; determining a parasitic capacitance value for each polygon; determining multiple parasitic resistance values for each polygon; determining a total capacitance value of the 2D conductive element based on the parasitic capacitance value for each polygon; and determining a total resistance value of the 2D conductive element based on the multiple parasitic resistance values for each polygon.

20 Claims, 14 Drawing Sheets

200

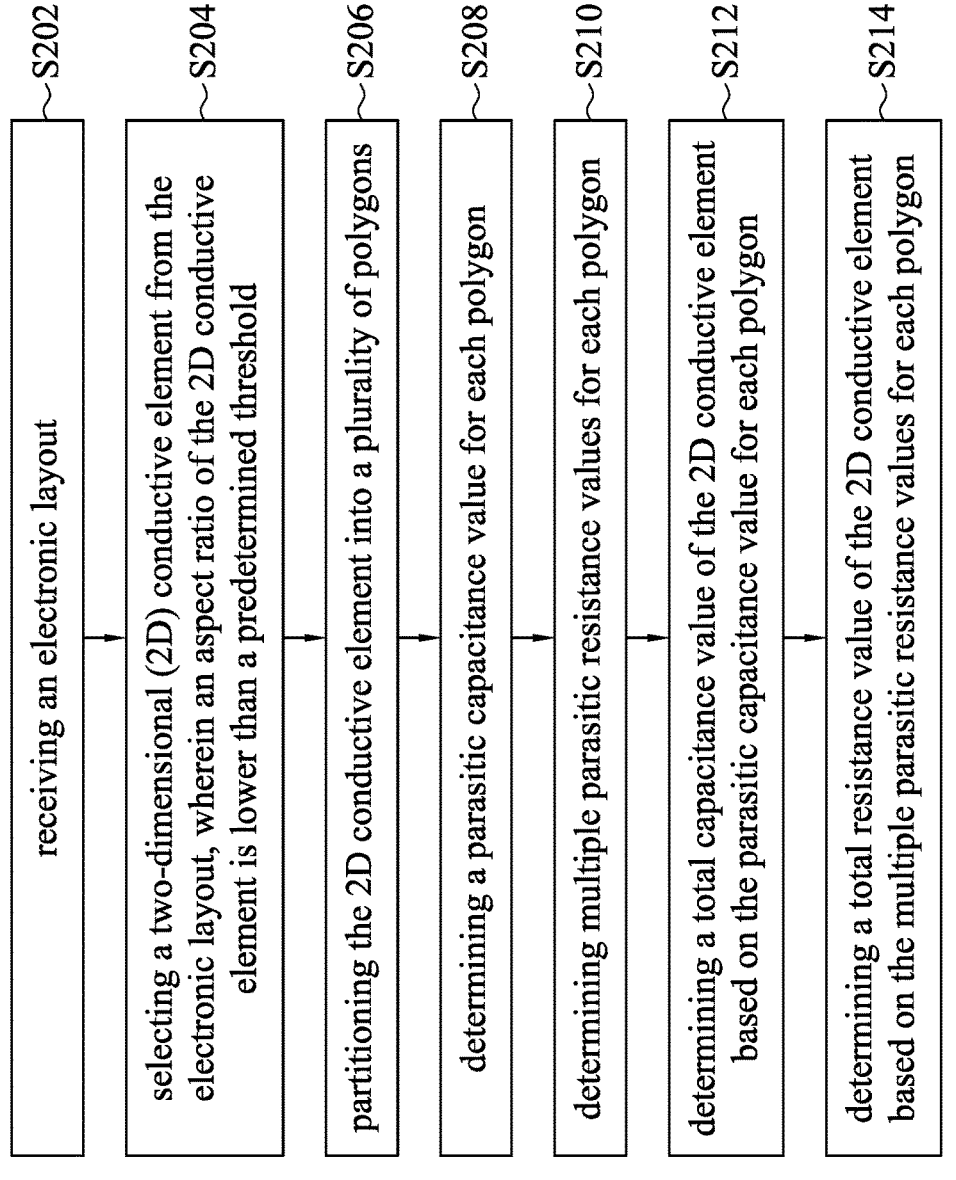

200

S202 receiving an electronic layout

S204 selecting a two-dimensional (2D) conductive element from the electronic layout, wherein an aspect ratio of the 2D conductive element is lower than a predetermined threshold

S206 partitioning the 2D conductive element into a plurality of polygons

S208 determining a parasitic capacitance value for each polygon

S210 determining multiple parasitic resistance values for each polygon

S212 determining a total capacitance value of the 2D conductive element based on the parasitic capacitance value for each polygon

S214 determining a total resistance value of the 2D conductive element based on the multiple parasitic resistance values for each polygon

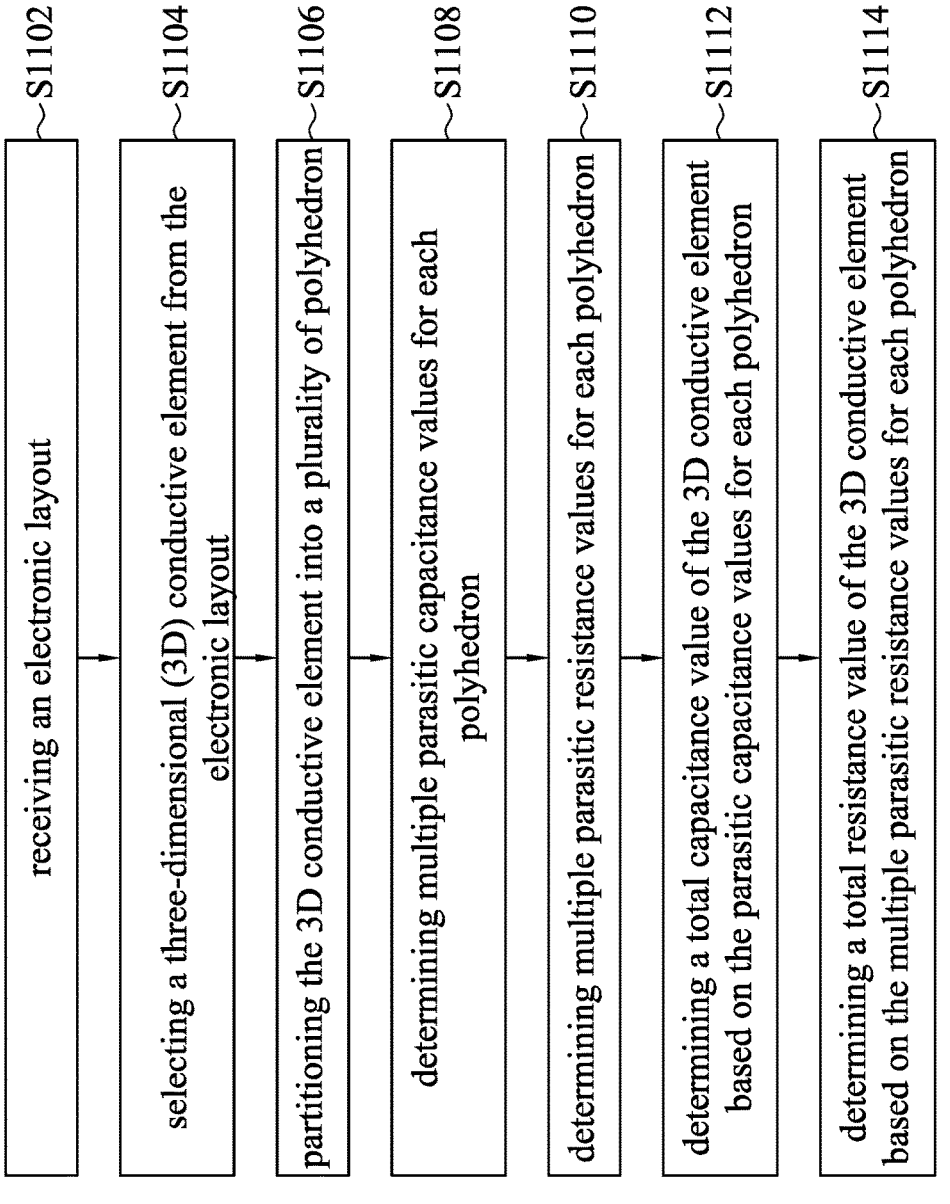

1100

S1102 — receiving an electronic layout

S1104 — selecting a three-dimensional (3D) conductive element from the electronic layout S1106 — partitioning the 3D conductive element into a plurality of polyhedron S1108 — determining multiple parasitic capacitance values for each polyhedron S1110 — determining multiple parasitic resistance values for each polyhedron S1112 — determining a total capacitance value of the 3D conductive element based on the parasitic capacitance values for each polyhedron S1114 — determining a total resistance value of the 3D conductive element based on the multiple parasitic resistance values for each polyhedron

FIG. 11

PARASITIC RESISTANCE AND CAPACITANCE EXTRACTION METHODS AND NON-TRANSITORY COMPUTER-READABLE MEDIA THEREOF

BACKGROUND

An integrated circuit (IC) typically includes a number of semiconductor devices represented in an IC layout diagram. The IC layout diagram is generated from an IC schematic, such as an electrical diagram of the IC. At various steps during the IC design process, from the IC schematic to the IC layout diagram for actual manufacture of the IC, various simulations, checks, and tests are performed to make sure that the IC can be made and will function as designed. Resistance and capacitance (RC) extraction is one of the most important and essential simulations in the process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a functional flowchart of a method in accordance with some embodiments of the present disclosure.

FIG. 11 is a flowchart of a method in accordance with some embodiments of the present disclosure.

DETAILED DESCRIPTION

Figure 1:
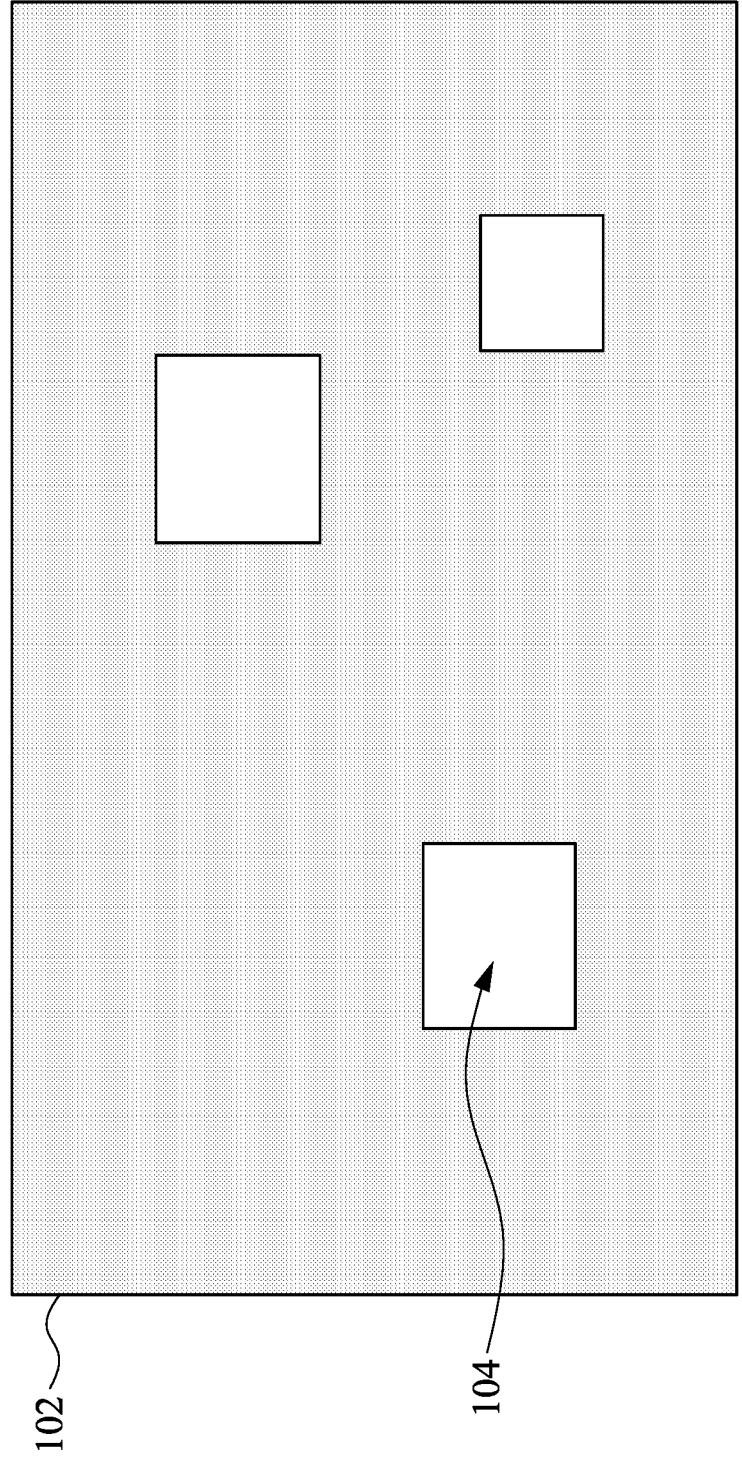
FIG. 1 shows a 2D metal plate in accordance with some embodiments of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like are also contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the like thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Parasitic resistance and parasitic capacitance are non-ideal phenomenon caused by parasitic effects. In the field of circuit design, to achieve a more accurate circuit performance simulation, such non-ideal characteristics may be estimated by a process called resistance and capacitance (RC) extraction. ARC extraction may be performed using various Electronic Design Automation (EDA) or Computer Aided Design (CAD) tools. In addition to estimate or determine the parasitic resistance and capacitance of one-dimensional (1D) electrical components, such as metal wires or vias, at least some embodiments of the present disclosure are capable of accurately determining the parasitic resistance and capacitance of two-dimensional (2D) electrical components, such as metal plates or metal-insulator-metal (MIM) capacitors. In at least some further embodiments of the present disclosure, the parasitic resistance and capacitance of three-dimensional (3D) electrical components can also be accurately determined. In some embodiments, it is defined that a 2D electrical component has an aspect ratio lower than a predetermined threshold. For example, the predetermined threshold may be 0.1 That is, the width of a 2D electrical component may be smaller than one tenth of the length thereof.

Usually, the length of an electrical component, such as a wire, is defined by the direction parallel to the electrical current direction, and the width of an electrical component is defined by the direction perpendicular to the electrical current direction. The difficulty in estimating the parasitic resistance and capacitance of 2D electrical components lies in that the length and the width of 2D electrical components are hard to define, since in 2D electrical components, the current direction is also 2D. The difficulty is more serious when there are holes within the 2D electrical component. For example. FIG. 1 shows a 2D metal plate 102 including three metal holes 104, wherein the three metal holes 104 may make the length and the width of the 2D metal plate 102 hard to define. Furthermore, different parasitic resistance and capacitance extraction topology results in different frequency response, which is important parameter for MIM capacitor. Accordingly, a more accurate and reliable method for estimating or determining the parasitic resistance and capacitance of 2D or even 3D electrical components is needed.

At least some embodiments of the present disclosure propose a better method or algorithm to estimate or determine the parasitic resistance and capacitance of 2D and 3D electrical components. For example, FIG. 2 is a flowchart of a proposed method which is at least capable of determining the parasitic resistance and capacitance of 2D electrical components.

In at least one embodiment, method 200 may be performed in whole or in part by a processor. Method 200 may be included or incorporated in one or more EDA tools or CAD tools for testing a design of a semiconductor device before manufacturing the same device. The EDA or CAD tools in some embodiments of the present disclosure are one or more sets of executable instructions for execution by a processor or controller or a programmed computer to perform the indicated functionality.

In operation S202, an electronic layout is read or received. In at least one embodiment, the electronic layout is received or read from a non-transitory, computer readable storage medium. The electronic layout may be generated based on a design of a semiconductor device, which may include a schematic, i.e., an electrical diagram, of a semiconductor device. A schematic is generated or provided in the form of a schematic netlist, such as a Simulation Program with Integrated Circuit Emphasis (SPICE) netlist.

In operation S204, a 2D conductive element in the received electronic layout is selected. The 2D conductive element may be a metal plate or an MIM capacitor. The 2D conductive element may include metal holes. The selection of one 2D conductive element does not indicate that the proposed method can only be used on a single element. Instead, by repeating the operations as described, the parasitic resistance and capacitance of all 2D conductive elements in the received electronic layout can be estimated or determined.

Figure 3:
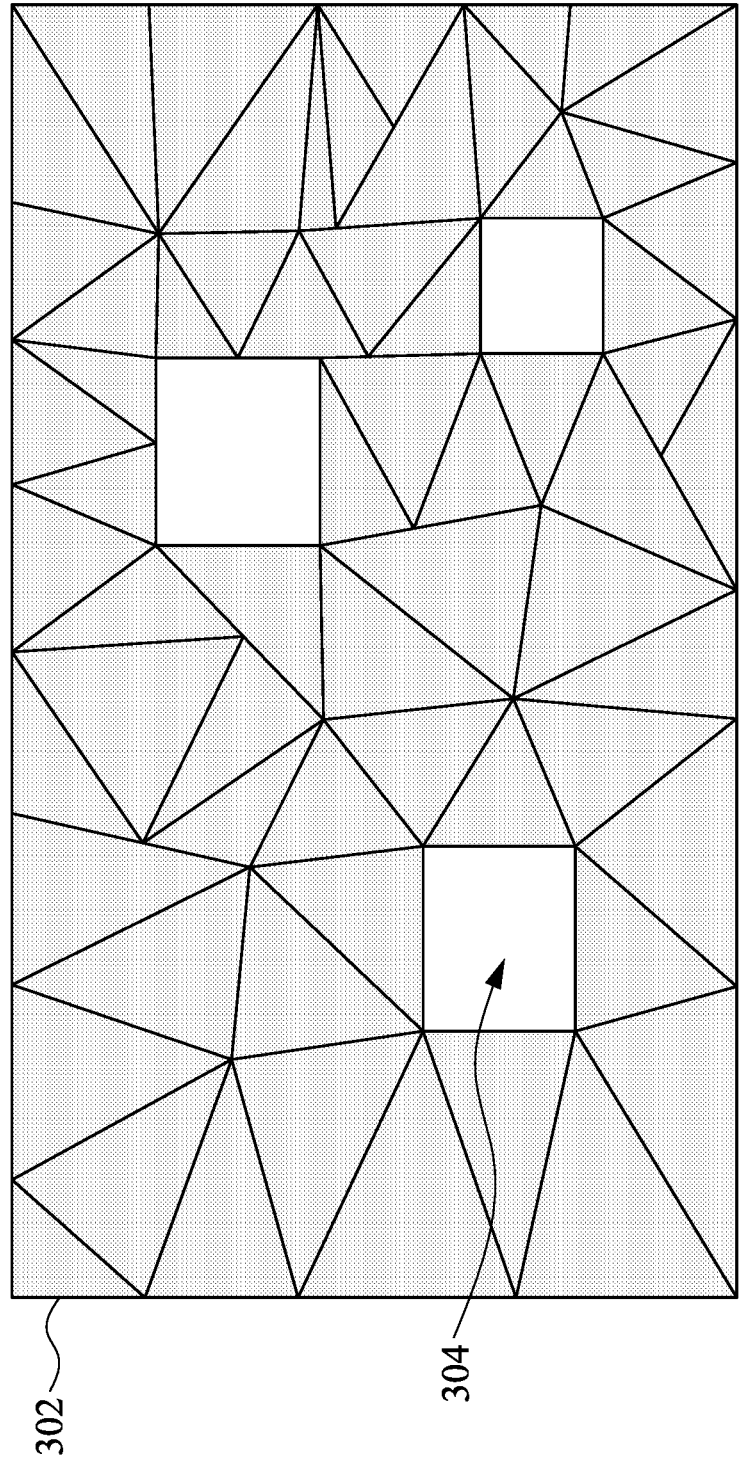
FIG. 3 shows a partitioned 2D metal plate in accordance with some embodiments of the present disclosure.
Figure 10:
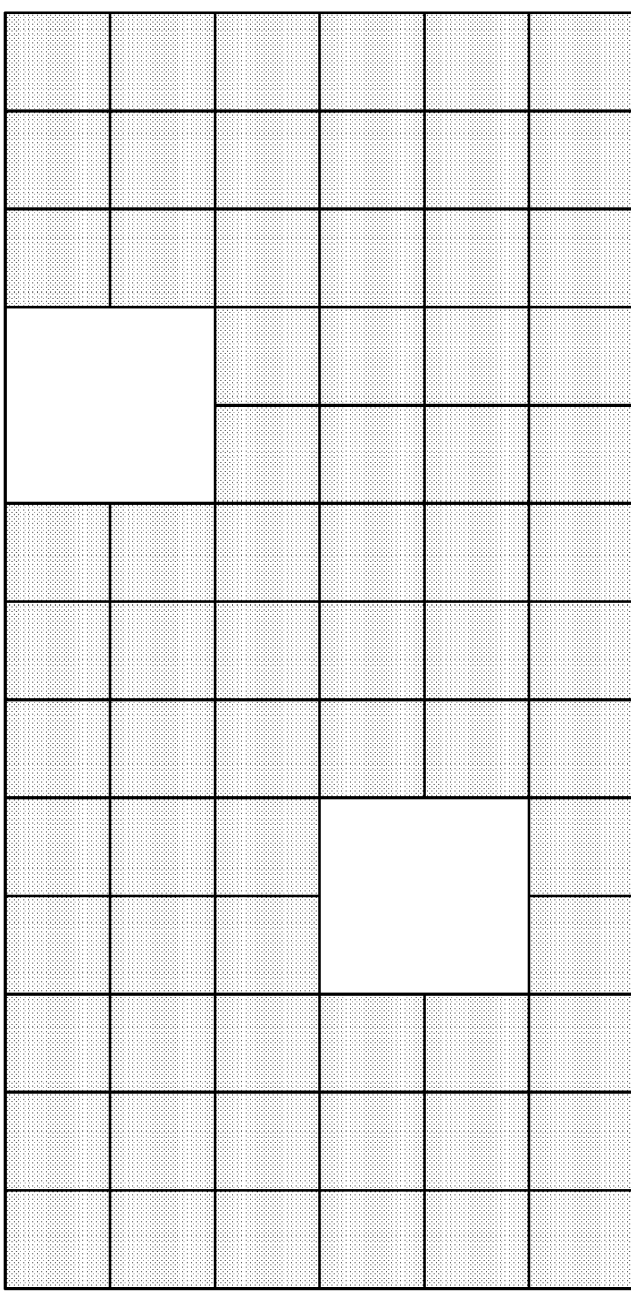
FIG. 10 shows a 2D metal plate with two metal holes in accordance with some embodiments of the present disclosure.

In operation S206, the selected 2D conductive element is partitioned into a plurality of polygons. The plurality of polygons may comprise triangles or rectangles. For example, FIG. 3 shows a partitioned 2D metal plate 302 in accordance with some embodiments of the present disclosure. The 2D metal plate 302, including three metal holes, may be partitioned into a plurality of triangles. Other polygons are also acceptable, for example, pentagons, hexagons, etc., provided that such configuration better fits the needs of the user. For example, for a 2D rectangle metal plate with two rectangle metal holes as shown in FIG. 10, partitioning the rectangle metal plate into a plurality of rectangles may make the partition operation easier.

Sizes of the polygons can be adjusted or controlled based on need. In principle, partitioning the selected 2D conductive element into smaller polygons may result in better accuracy, but will require more simulation runtime at the same time. In practice, a balanced accuracy and runtime requires time for trial and error. The present disclosure proposes an algorithm to determine a relatively balanced size (relevant to accuracy) of the polygons.

The size of the polygon may be controlled by the maximum length of any edge (sometimes called "side") of the polygon. In at least some embodiments of the present disclosure, the maximum length of each edge of the plurality of polygons may be equal to or smaller than one tenth of a wavelength under a maximum operating frequency, when the selected 2D conductive element is operated under alternating current (AC). The wavelength can be calculated by dividing the speed of light (represented by "c") by the maximum operating frequency. In at least some embodiments of the present disclosure, when the selected 2D conductive element is operated under direct current (DC), the maximum length of each edge of the plurality of polygons may be equal to or smaller than one tenth of a wavelength under 1K Hz or 1 M Hz.

In at least some embodiments of the present disclosure, operation S206 may be repeated when the length of any edge of the polygon is larger than the defined maximum length. In other words, operation S206 is performed on each of the plurality of polygons until the size of each of the plurality of polygons is small enough, i.e., all edges of each polygon is smaller than the defined maximum length.

In at least some embodiments of the present disclosure, to further determine the location and value of the parasitic resistance and capacitance of each partitioned polygon (i.e., polygons having edges each smaller than the defined maximum length), several nodes are to be created. First, an internal node is created within an internal area of each polygon. In accordance with some embodiments of the present disclosure, the internal node of each polygon is located at a centroid of each polygon. Second, an edge node on each edge of each polygon is created. In accordance with some embodiments of the present disclosure, the edge node is located at the center of each edge of each polygon.

Figure 4:
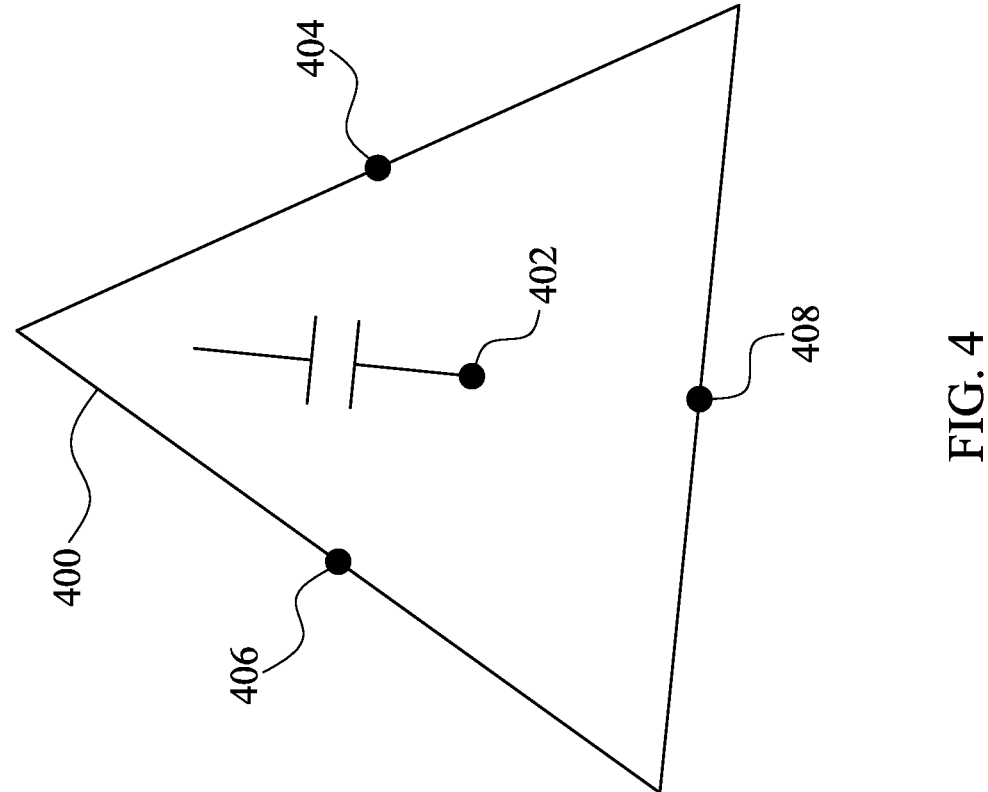
FIG. 4 shows a partitioned triangle including an internal node and multiple edge nodes in accordance with some embodiments of the present disclosure.

To make the illustration more specific and clear, the 2D metal plate 102 in FIG. 1 is used as an example. As depicted in FIG. 3, the 2D metal plate 302 is partitioned into a plurality of triangles. Referring now to FIG. 4, triangle 400 may be one of the triangles in the 2D metal plate 302 of FIG. 3. An internal node 402 is created inside the triangle 400. The internal node 402 may be located at the centroid of triangle 400. Three edge nodes 404, 406, and 408 are created on each edge of the triangle 400. The edge nodes 404, 406, and 408 may be located at the center of each edge of the triangle 400.

In operation S208, the parasitic capacitance value of each polygon is determined. In at least some embodiments of the present disclosure, the parasitic capacitance value of each polygon may be determined to be placed at the internal node. In addition, the parasitic capacitance value of each polygon may be determined based on the area of each polygon. To be more specific, the parasitic capacitance value of each polygon may be determined based on the formula $$C = \varepsilon \frac{A}{d},$$

wherein C represents the parasitic capacitance value, $\varepsilon$ represents the dielectric constant of the associated polygon, A represents the effective area of the associated polygon and the neighboring conductive material, and d represents the distance between the associated polygon and the neighboring conductive material.

For example, for the triangle 400 in FIG. 4, the parasitic capacitance value of the triangle 400 may be placed at the internal node 402. The parasitic capacitance value of the triangle 400 may be determined based on the area of the triangle 400. In some embodiments of a MIM capacitor, the parasitic capacitance value of the triangle 400 may be determined based on the area of triangle 400 (i.e., the overlapping area of the triangle 400 and the corresponding triangle under or over the triangle 400) and the distance between the triangle 400 and the corresponding triangle under or over the triangle 400.

In operation S210, multiple parasitic resistance values for each polygon are determined. The calculation of the parasitic resistance of the polygon is more complicated than the calculation of the parasitic capacitance. In at least some embodiments of the present disclosure, each polygon may be further partitioned into a plurality of triangles (hereinafter "small triangle" or "small triangles" to better distinguish triangles referring to). Each triangle is formed by (1) two adjacent vertices of the polygon and (2) the internal node of the polygon. For one small triangle, the edge formed by the two adjacent vertices of the polygon, which is the edge where one of the edge nodes is on, is further referred to as a "resistor edge."

Figure 5:
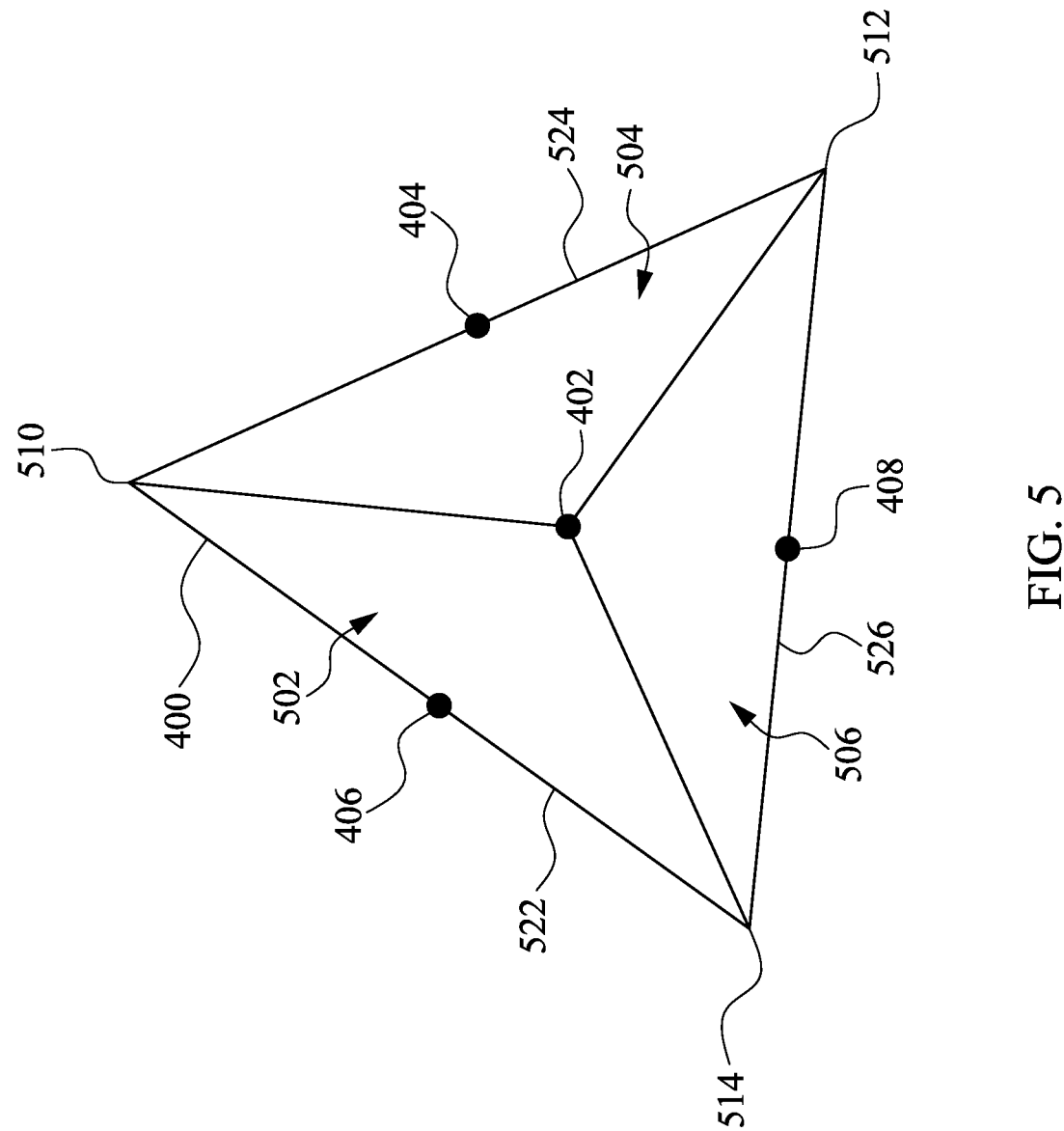
FIG. 5 shows a partitioned triangle with including three small triangles in accordance with some embodiments of the present disclosure.

For example, in FIG. 5, the triangle 400 in FIG. 4 is further partitioned into three small triangles 502, 504, and 506. Small triangle 502 is formed by (1) two adjacent vertices 510 and 514 and (2) the internal node 402 of the triangle 400. Small triangle 504 is formed by (1) two adjacent vertices 510 and 512 and (2) the internal node 402 of the triangle 400. Small triangle 506 is formed by (1) two adjacent vertices 512 and 514 and (2) the internal node 402 of the triangle 400. A resistor edge 522 is formed by two adjacent vertices 510 and 514 and the edge node 406 is on the resistor edge 522. A resistor edge 524 is formed by two adjacent vertices 510 and 512 and the edge node 404 is on the resistor edge 524. A resistor edge 526 is formed by two adjacent vertices 512 and 514 and the edge node 408 is on the resistor edge 526.

In at least some embodiments of the present disclosure, the parasitic resistance value of each small triangle may be determined to be between the internal node and the corresponding edge node. The parasitic resistance value of each small triangle may be determined to be between the internal node and the corresponding resistor edge. The parasitic resistance value of each small triangle may be determined based on the length between the corresponding resistor edge and the internal node.

Figure 6:
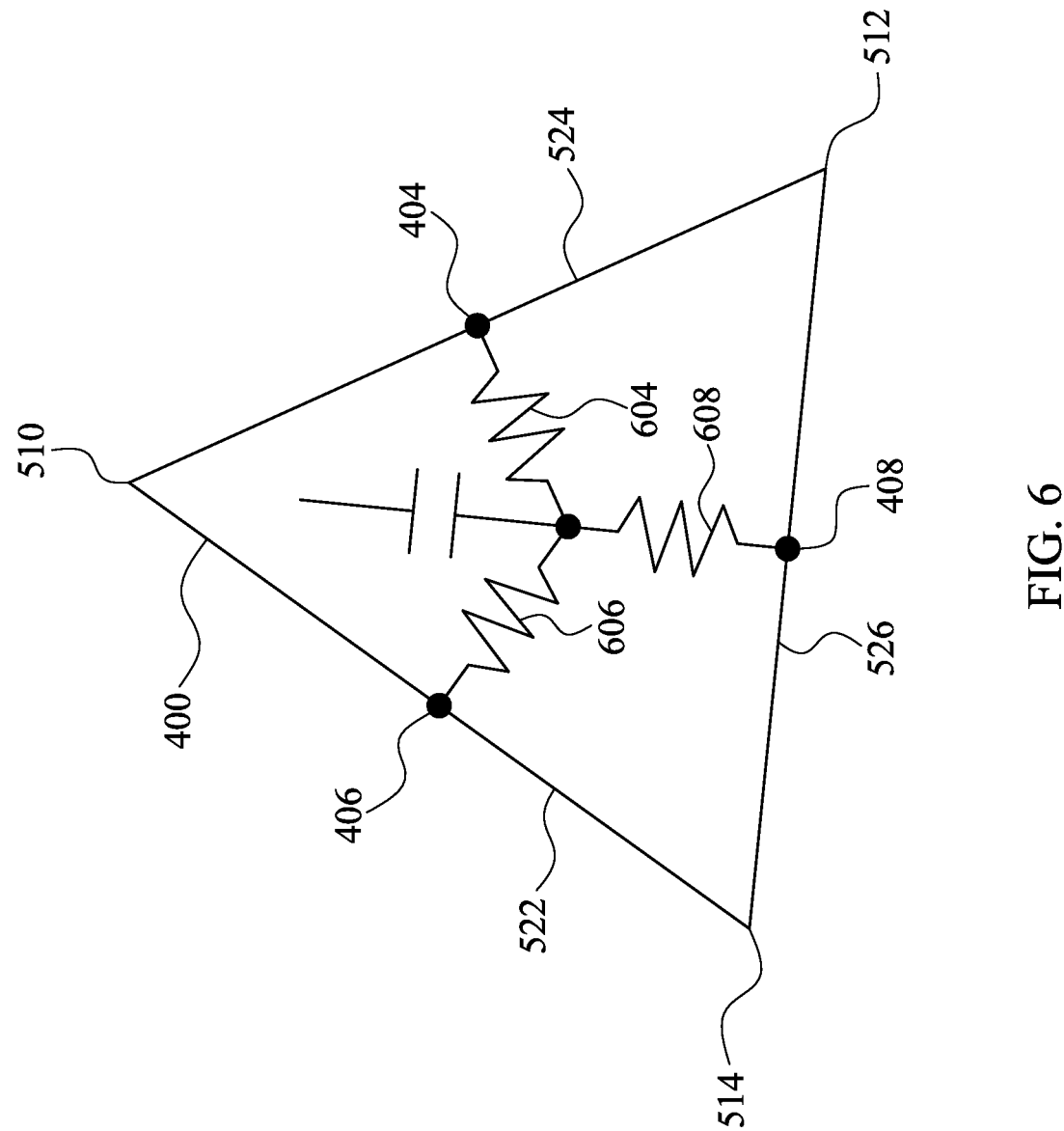
FIG. 6 shows parasitic resistance values of small triangles in accordance with some embodiments of the present disclosure.

For example, FIG. 6 illustrates the parameters of each parasitic resistance value of each small triangle in FIG. 5. The parasitic resistance value of resistance 604 is between the internal node 402 and the corresponding edge node 404. The parasitic resistance value of resistance 604 may be determined based on the length between the resistor edge 524 and the internal node 402. The parasitic resistance value of resistance 606 is between the internal node 402 and the corresponding edge node 406. The parasitic resistance value of resistance 606 may be determined based on the length between the resistor edge 522 and the internal node 402. The parasitic resistance value of resistance 608 is between the internal node 402 and the corresponding edge node 408. The parasitic resistance value of resistance 608 may be determined based on the length between the resistor edge 526 and the internal node 402.

In at least some embodiments of the present disclosure, the determination of the parasitic resistance value of each small triangle may further comprise the following steps: (1) approximating each small triangle to a plurality of rectangles (hereinafter "small rectangle" or "small rectangles" to better distinguish thereamong), wherein the small rectangles are arranged close to each other and parallel to the corresponding resistor edge; (2) based on lengths of the small rectangles parallel to the resistor edge and widths of the small rectangles perpendicular to the lengths, determining the resistance value of each small rectangle; and (3) determining the parasitic resistance value of each small triangle. For example, the parasitic resistance value of one small triangle can be determined based on the sum of the resistance values of the small rectangles.

The algorithm behind the determination of the parasitic resistance value of each small triangle is based on the method of integration. A small triangle can be approximated to a combination of a number of small rectangles. When the number of small rectangles becomes large, i.e., the small triangle is approximated to a combination of multiple small rectangles with smaller area, the sum of the combination will become closer to the small triangle. For example, a small triangle may be approximated to a combination of five, fifty, or five thousand small rectangles. The approximation error between the small triangle and the sum of five small rectangles will be larger than that between the small triangle and the sum of fifty small rectangles. Similarly, the approximation error between the small triangle and the sum of fifty small rectangles will be larger than that between the small triangle and the sum of five thousand small rectangles. That is to say, the approximation error will approach zero as the number of small rectangles becomes large. The approximation of small triangles may comprise partitioning the small triangle into a plurality of rectangles. Other approximation methods for determining the parasitic resistance value may be applied.

Since the shape of small rectangles, whose aspect ratio is large, is similar to 1D conductive wires, the parasitic resistance value of each small rectangle may be determined by methods used to determine the parasitic resistance of 1D elements. For example, the parasitic resistance for each small rectangle may be determined by the formula $$R = \frac{\rho \times l}{w \times t},$$

wherein ρ represents the resistivity of the conductive element (e.g., the small rectangle of the 2D metal plate), 1 represents the length of the conductive element (e.g., the small rectangle of the 2D metal plate), w represents the width of the conductive element (e.g., the small rectangle of the 2D metal plate), and t represents the thickness of the conductive element (e.g., the small rectangle of the 2D metal plate).

Furthermore, since the small rectangles are arranged in parallel and close to each other, the parasitic resistances thereof may be considered to be coupled in series. Accordingly, the overall parasitic resistance value of each small triangle may be determined by the sum of the resistance values of the small rectangles.

Figure 7A:
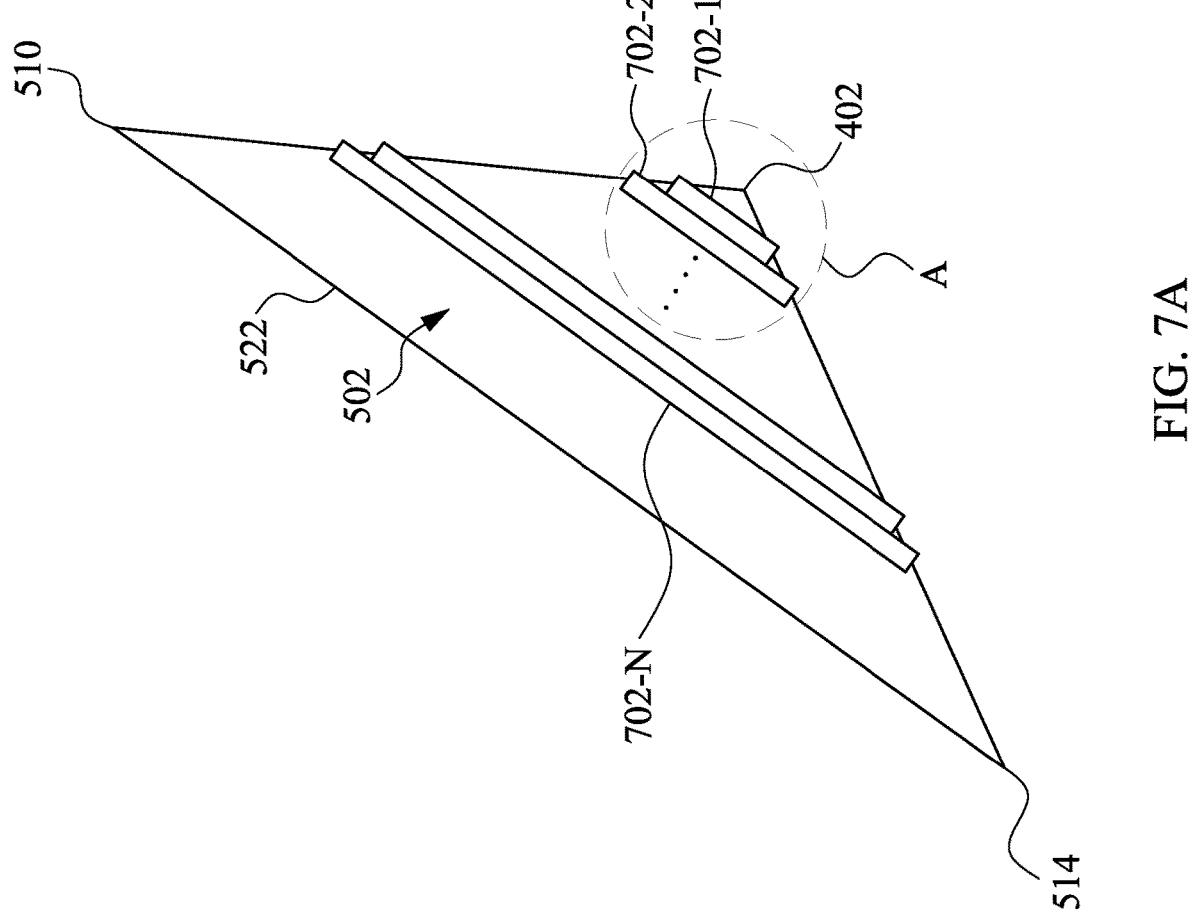
FIGS. 7A and 7B show approximated rectangles for a small triangle in accordance with some embodiments of the present disclosure.
Figure 7B:
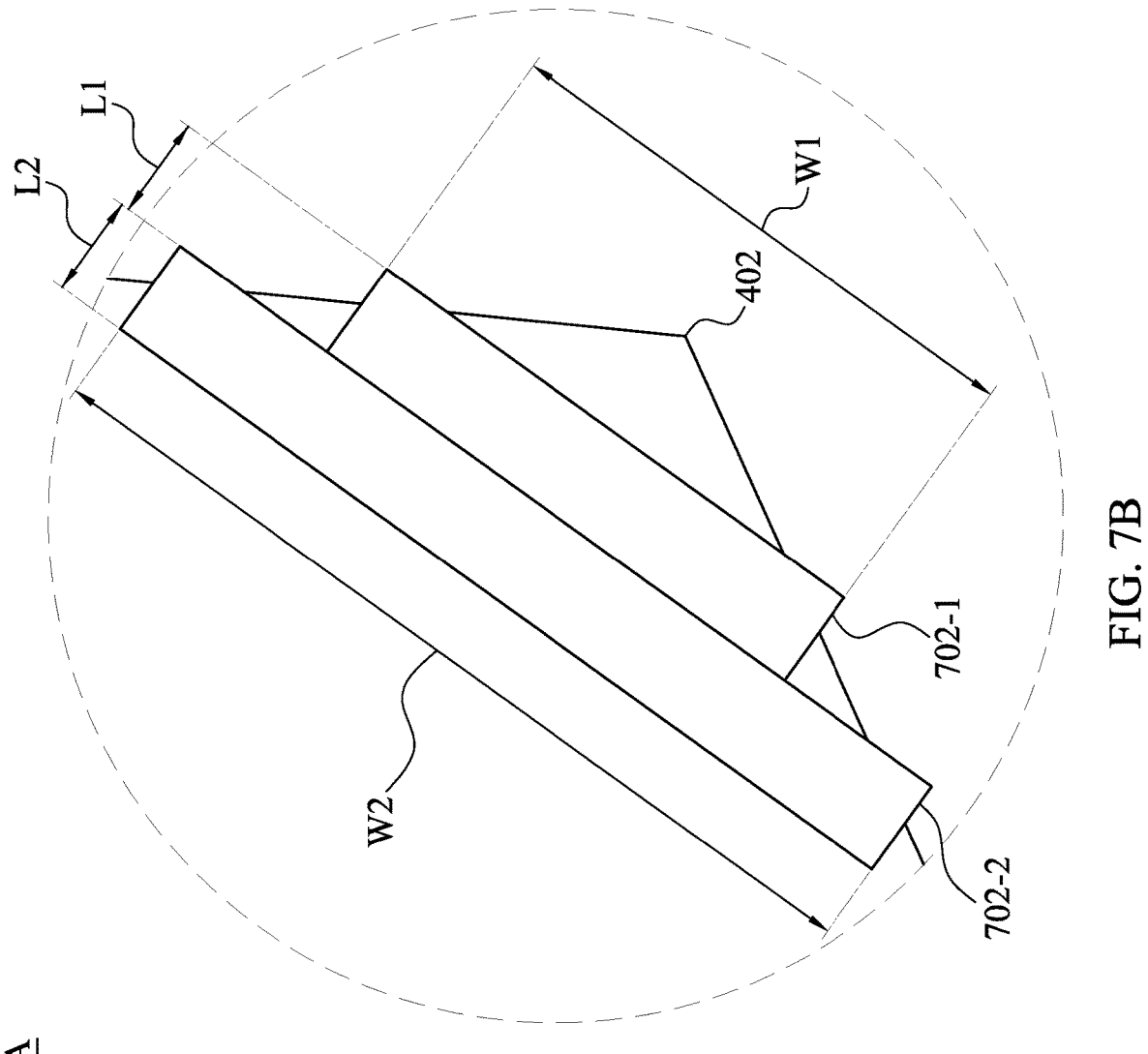

For example, FIG. 7A depicts how the small triangle 502 in FIG. 5 can be approximated to a plurality of rectangles. Small triangle 402 is partitioned into N small rectangles 702-1, 702-2, . . . , 702-N. Small rectangles are arranged close to each other and parallel to the resistor edge 522. Referring to FIG. 7B, the parasitic resistance value of the small rectangles 702-1 is determined based on the length L1 and width W1 thereof, the parasitic resistance value of the small rectangles 702-2 is determined based on the length L2 and width W2 thereof and so on (readers should note that the length is defined by the direction parallel to the electrical current direction, and the width of an electrical component is defined by the direction perpendicular to the electrical current direction). Based on the calculation of the parasitic resistance values of the small rectangles 702-1, 702-2, . . . , 702-N, the overall parasitic resistance value of the small triangle 502 may be determined by summing up the parasitic resistance values of the small rectangles 702-1, 702-2, . . . , 702-N. After the summing up, the overall parasitic resistance for the triangle 400 may be represented by FIG. 6.

Figure 8:
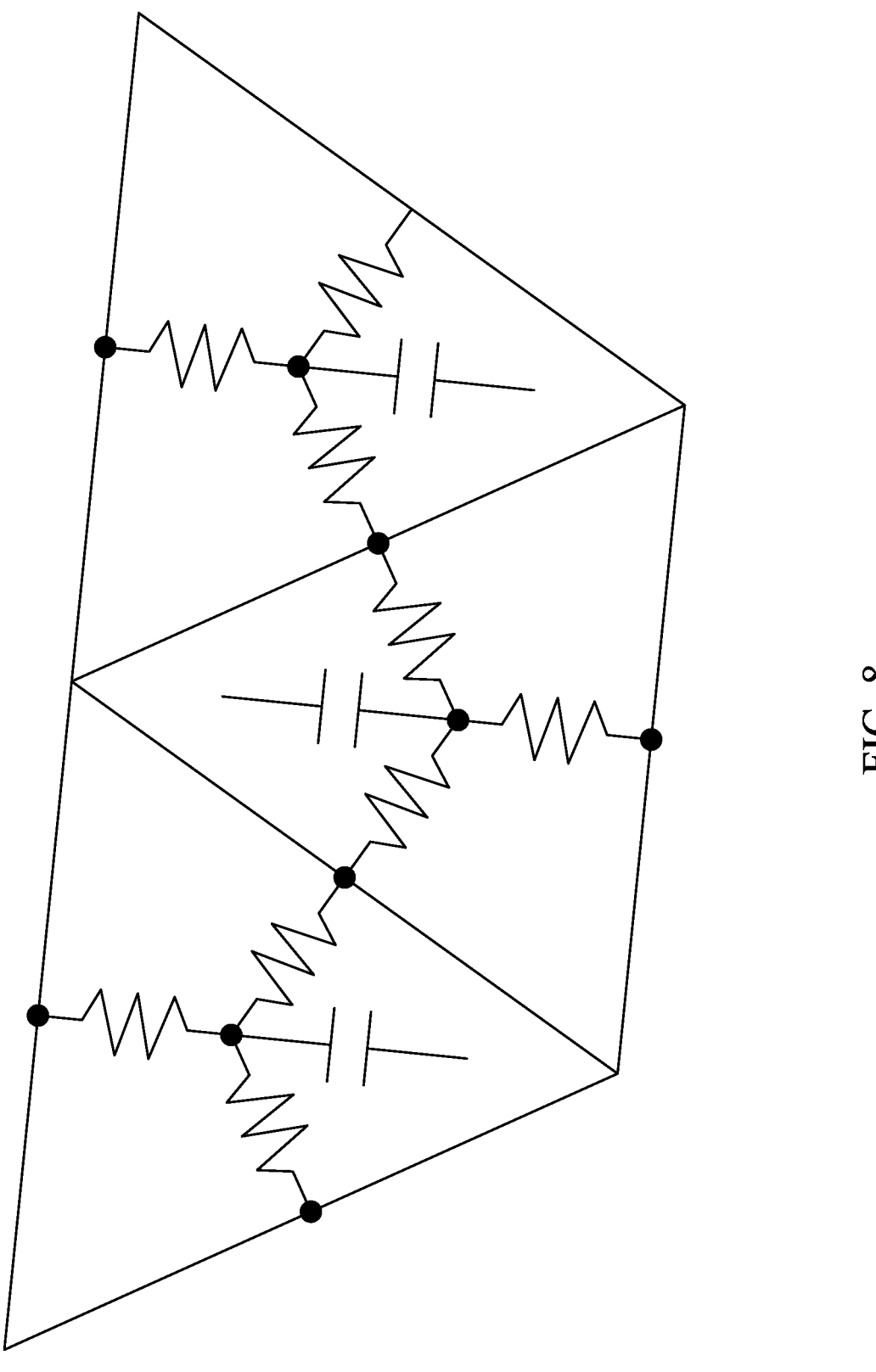
FIG. 8 shows a portion of a 2D conductive component in accordance with some embodiments of the present disclosure.

FIG. 8 shows an example of a portion of a 2D conductive component after the determination of parasitic capacitance and resistance of each polygon. In the arrangement shown in FIG. 8, the total parasitic capacitance and resistance for the 2D conductive component may be determined. The portion of the 2D conductive component includes some polygons.

In operation S212, a total parasitic capacitance value for the original 2D conductive component may be determined based on the parasitic capacitance value for each polygon. In at least some embodiments of the present disclosure, the parasitic capacitance may be coupled between the internal node and the ground.

In operation S214, a total parasitic resistance for the original 2D conductive component may be determined based on the multiple parasitic resistance values for each polygon. In at least some embodiments of the present disclosure, a parasitic resistor may be coupled to an internal node and an edge node of a small triangle, connecting to another parasitic capacitance of another small triangle.

Figure 9A:
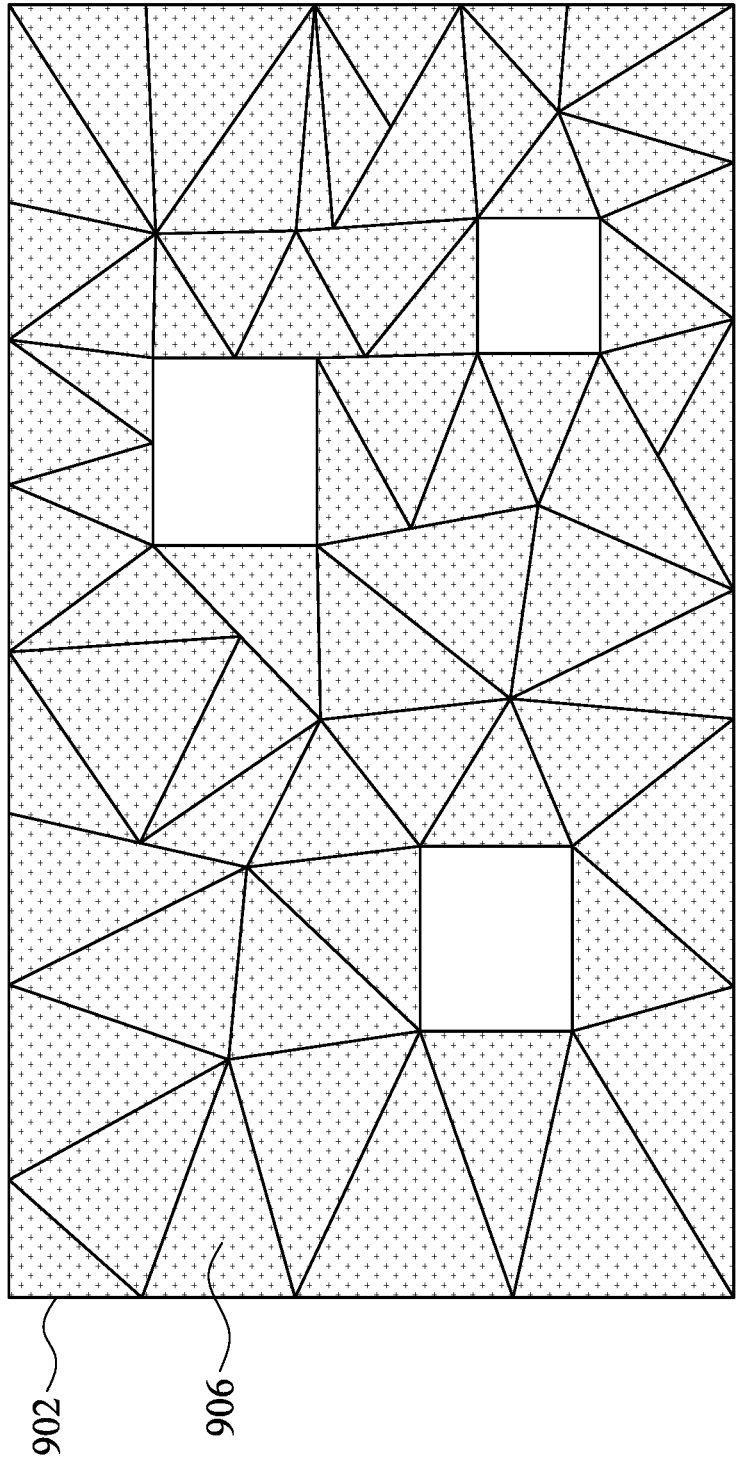
FIGS. 9A and 9B show an exemplary MIM capacitor including a bottom plate and a top plate in accordance with some embodiments of the present disclosure.
Figure 9B:
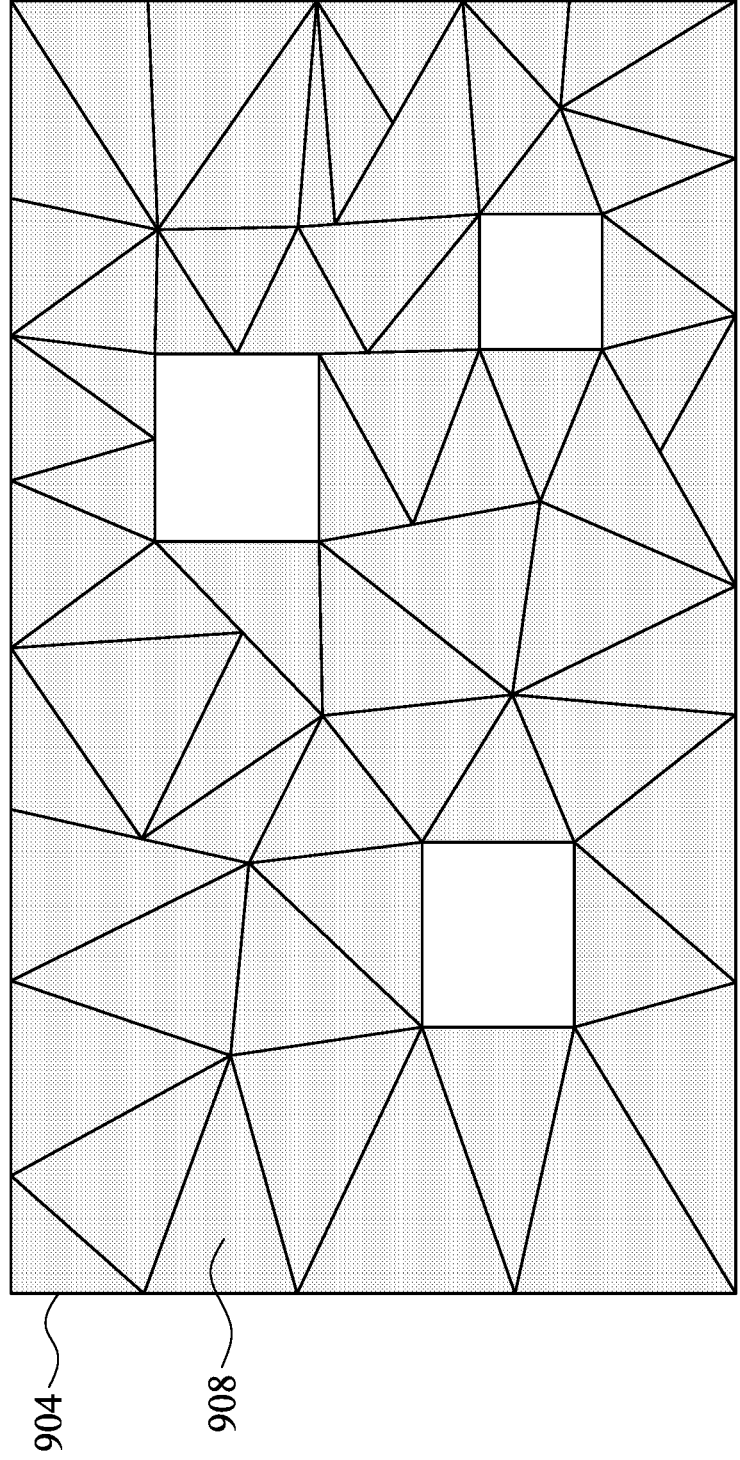

RC extraction methods may encounter difficulty in calculating the parasitic capacitance of MIM capacitors. The present disclosure may be especially useful when determining the parasitic capacitance of MIM capacitors. MIM capacitors are usually formed by two or more identical 2D metal plates with metal holes or two or more 2D metal plates of similar shape. FIG. 9A shows a bottom plate 902 of an exemplary MIM capacitor, and FIG. 9B shows a top plate of the same exemplary MIM capacitor. The bottom plate 902 and the top plate 904 of the exemplary MIM capacitor may be identical. Because of the similarity of the shape of the metal plates, the metal plates may be partitioned by the same partitioning pattern. For example, the small triangles in the top plate 904 of the MIM capacitor match the small triangles in the bottom plate 902 of the MIM capacitor. Using the same partitioning pattern, there is no need to decide the partitioning pattern for each metal plate in the MIM capacitor, so runtime can be further reduced. In addition, the partitioned polygons in the two or more metal plates may have a one-by-one mapping relationship. For example, the small triangle 906 in the bottom plate 902 of the MIM capacitor may be mapped to the small triangle 908 in the top plate 904 of the MIM capacitor. With the one-by-one mapping, the parasitic capacitance (or coupling capacitance) of the MIM capacitor may be determined by the sum of the parasitic capacitance (or coupling capacitance) between each corresponding polygons of the two metal plates.

One of the benefits of the present disclosure includes providing a systematic way to extract the parasitic resistance and capacitance for 2D plates with better accuracy and providing a more accurate resistor and capacitor network for MIM capacitors.

As mentioned earlier, the recited method can be extended to the estimation or determination of the parasitic resistance and capacitance of 3D electrical components. The concept behind the determination of the parasitic resistance and capacitance of 3D electrical components is substantially similar to that of 2D electrical components. For example, FIG. 11 is a flowchart of a proposed method, at least capable of determining the parasitic resistance and capacitance of 3D electrical components.

In at least one embodiment, method 1100 may be performed in whole or in part by a processor. Method 1100 may be included or incorporated in one or more FDA tools or CAD tools for testing a design of a semiconductor device before manufacturing the same device. The EDA or CAD tools in some embodiments of the present disclosure are one or more sets of executable instructions for execution by a processor or controller or a programmed computer to perform the indicated functionality.

In operation S1102, an electronic layout is read or received. In at least one embodiment, the electronic layout is received or read from a non-transitory, computer readable storage medium. The electronic layout may be generated based on a design of a semiconductor device, which may include a schematic, i.e., an electrical diagram, of a semiconductor device. A schematic is generated or provided in the form of a schematic netlist, such as a Simulation Program with Integrated Circuit Emphasis (SPICE) netlist.

In operation S1104, a 3D conductive element in the received electronic layout is selected. The selection of one 3D conductive element does not indicate that the proposed method can only be used on a single element. Instead, by repeating the operations as described below, the parasitic resistance and capacitance of all 3D conductive elements in the received electronic layout can be estimated or determined.

In operation S1106, the selected 3D conductive element is partitioned into a plurality of polyhedrons. The plurality of polyhedrons may comprise tetrahedrons. Other polygons, for example, cuboids, are also acceptable, provided that such configuration better fits the needs of the user.

The size of the plurality of polyhedrons can be adjusted or controlled based on need. In principle, partitioning the selected 3D conductive element into polyhedrons of lower volume may result in better accuracy, but it will require increased simulation runtime at the same time. In practice, a balanced accuracy and runtime requires time for trial and error.

In operation S1108, the parasitic capacitance value of each polyhedron is determined. In at least some embodiments of the present disclosure, the parasitic capacitance value of each polyhedron may be determined based on the area of a face the polyhedron.

In operation S1110, multiple parasitic resistance values for each polyhedron are determined. The calculation of the parasitic resistance of the polyhedron is more complicated than the calculation of the parasitic capacitance. In at least some embodiments of the present disclosure, each polyhedron may be further partitioned into a plurality of tetrahedrons (hereinafter "small tetrahedron" or "small tetrahedrons" to better distinguish tetrahedrons referring to). Each tetrahedron is formed by (1) two adjacent edges of the polyhedron and (2) the centroid of the polyhedron. The face formed by the two adjacent edges is further referred to as a "resistor face."

In at least some embodiments of the present disclosure, the parasitic resistance value of each small tetrahedron may be determined based on the length between the corresponding resistor face and the centroid node.

In at least some embodiments of the present disclosure, the determination of the parasitic resistance value of each small tetrahedron may further comprise the following steps: (1) approximating each small tetrahedron to a plurality of cuboids (hereinafter "small cuboid" or "small cuboids" to better distinguish thereamong), wherein the small cuboids are arranged close to each other and in a first direction orthogonal to the corresponding resistor face; (2) based on areas of the small cuboids in parallel with the resistor face and lengths of the plurality of cuboids in the first direction, determining the resistance value of each small cuboid and (3) determining the parasitic resistance value of each small tetrahedron. For example, the parasitic resistance value of one small tetrahedron can be determined based on the sum of the resistance values of the small cuboids.

Since the small cuboids are arranged in parallel and close to each other, the parasitic resistances thereof may be considered to be coupled in series. Accordingly, the overall parasitic resistance value of each small tetrahedron may be determined by the sum of the resistance values of the small cuboids.

In operation S1112, a total parasitic capacitance value for the original 3D conductive component may be determined based on the parasitic capacitance value for each polyhedron. In at least some embodiments of the present disclosure; the parasitic capacitance may be coupled to the centroid node and the ground.

In operation S1114, a total parasitic resistance for the original 3D conductive component may be determined based on the multiple parasitic resistance values for each polyhedron. In at least some embodiments of the present disclosure, a parasitic resistor may be coupled to a centroid node and an edge node of a small tetrahedron, which connecting, to another parasitic capacitance of another small tetrahedron.

Figure 12:
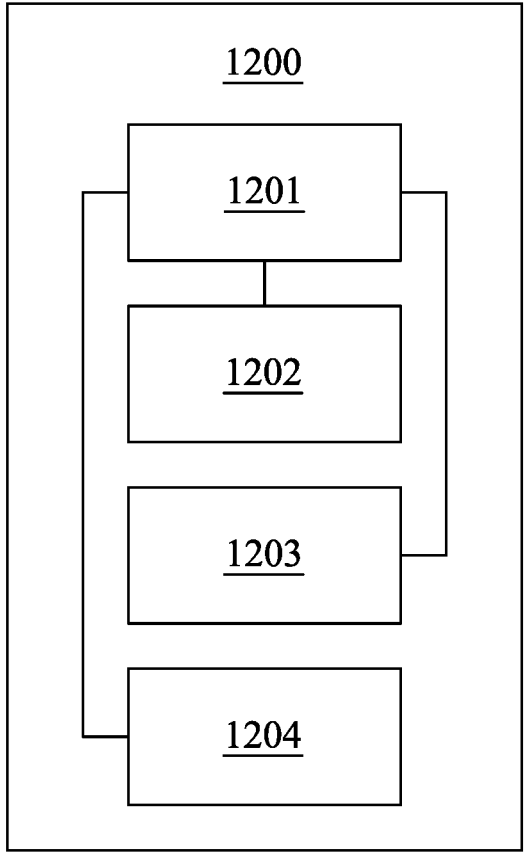
FIG. 12 is a schematic diagram showing a computer system in accordance with some embodiments of the present disclosure.

Referring to FIG. 12, it shows an example of a computer system capable of performing one or more operations of the methods of the present disclosure. The computer system includes, in at least some embodiments of the present disclosure, a computing device 1200. The computing device 1200 may be a server computer, a client computer, a personal computer (PC), a tablet PC, a set-top box (STB), a personal digital assistant (PDA), a cellular telephone, or a smartphone. The computing device 1200 comprises processor 1201, input/output interface 1202, communication interface 1203, and memory 1204. The input/output interface 1202 is coupled with the processor 1201. The input/output interface 1202 allows the user to manipulate the computing device 1200 in order to perform the methods of the present disclosure (e.g., the method disclosed in FIGS. 2 and 11). The communication interface 1203 is coupled with the processor 1201. The communication interface 1203 allows the computing device 1200 to communicate with data outside the computing device 1200, for example, receiving electronic layouts. A memory 1204 may be a non-transitory computer readable storage medium. The memory 1204 is coupled with the processor 1201. The memory 1204 has stored program instructions that can be executed by one or more processors (for example, the processor 1201). Upon execution of the program instructions stored on the memory 1204, the program instructions cause performance of the one or more operations of the method disclosed in the present disclosure. For example, the program instructions may cause the computing device 1200 to perform a set of acts that at least includes: (i) receiving an electronic layout; (ii) selecting a 2D conductive element from the electronic layout, wherein an aspect ratio of the 2D conductive element is below a predetermined threshold; (iii) partitioning the 2D conductive element into a plurality of polygons; (iv) determining a parasitic capacitance value for each polygon; (v) determining multiple parasitic resistance values for each polygon; (vi) determining a total capacitance value of the 2D conductive element based on the parasitic capacitance value for each polygon; and (vii) determining a total resistance value of the 2D conductive element based on the multiple parasitic resistance values for each polygon.

The noted actions may further comprise determining the parasitic capacitance value of the polygon based on an area of the polygon.

The set of acts may further comprise partitioning the polygon into a plurality of triangles, each triangle formed by two adjacent vertices of the polygon and a centroid node of the polygon, with each triangle including a resistor edge formed by the two adjacent vertices of the polygon, and for each triangle, based on a length between the resistor edge and the centroid node, determining a parasitic resistance value.

The noted actions may further comprise, for each triangle, partitioning the triangle into a plurality of rectangles, wherein the plurality of rectangles are arranged parallel to the resistor edge, for each triangle, based on widths of the plurality of rectangles parallel to the resistor edge and lengths of the plurality of rectangles perpendicular to the widths, determining resistance values of the plurality of rectangles; and determining the parasitic resistance value based on resistance values of the plurality of rectangles.

As another exemplary example, the program instructions may cause the computing device 1200 to perform a set of acts that at least includes: (i) receiving an electronic layout; (ii) selecting a three-dimensional (3D) conductive element from the electronic layout; (iii) partitioning the 3D conductive element into a plurality of polyhedrons; (iv) determining multiple parasitic capacitance values for each polyhedron; (v) determining multiple parasitic resistance values for each polyhedron; (vi) determining a total capacitance value of the 3D conductive element based on the parasitic capacitance values for each polyhedron; and (vii) determining a total resistance value of the 3D conductive element based on the multiple parasitic resistance values for each polyhedron.

Some embodiments of the present disclosure provide a method, the method comprising receiving an electronic layout, selecting a two-dimensional (2D) conductive element from the electronic layout, partitioning the 2D conductive element into a plurality of polygons, determining a parasitic capacitance value for each polygon, determining multiple parasitic resistance values for each polygon, determining a total capacitance value of the 2D conductive element based on the parasitic capacitance value for each polygon, and determining a total resistance value of the 2D conductive element based on the multiple parasitic resistance values for each polygon. An aspect ratio of the 2D conductive element is below a predetermined threshold.

Some embodiments of the present disclosure provide another method, the method comprising receiving an electronic layout, selecting a three-dimensional (3D) conductive element from the electronic layout, partitioning the 3D conductive element into a plurality of polyhedrons, determining multiple parasitic capacitance values for each polyhedron, determining multiple parasitic resistance values for each polyhedron, determining a total capacitance value of the 3D conductive element based on the parasitic capacitance values for each polyhedron, and determining a total resistance value of the 3D conductive element based on the multiple parasitic resistance values for each polyhedron.

Some embodiments of the present disclosure provide a non-transitory computer-readable medium. The non-transitory computer-readable medium has stored thereon program instructions. Upon execution of the program instructions by a processor, the program instructions cause performance of a set of actions comprising receiving an electronic layout, selecting a two-dimensional (2D) conductive element from the electronic layout, partitioning the 2D conductive element into a plurality of polygons, determining a parasitic capacitance value for each polygon, determining multiple parasitic resistance values for each polygon, determining a total capacitance value of the 2D conductive element based on the parasitic capacitance value for each polygon, and determining a total resistance value of the 2D conductive element based on the multiple parasitic resistance values for each polygon. An aspect ratio of the 2D conductive element is lower than a predetermined threshold.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method, comprising:
receiving an electronic layout;
selecting a two-dimensional (2D) conductive element from the electronic layout, wherein a ratio of a width to a length of the selected 2D conductive element is lower than a predetermined threshold, the width is perpendicular to an electrical current direction of the selected 2D conductive element, and the length is parallel to the electrical current direction;
partitioning the selected 2D conductive element into a plurality of polygons, wherein a maximum length of each edge of the plurality of polygons is equal to or smaller than one tenth of a wavelength under a maximum operating frequency;
determining a parasitic capacitance value for each of the plurality of polygons;
determining multiple parasitic resistance values for each of the plurality of polygons;
determining a total capacitance value of the selected 2D conductive element based on the parasitic capacitance value for each of the plurality of polygons;
determining a total resistance value of the selected 2D conductive element based on the multiple parasitic resistance values for each of the plurality of polygons; and
manufacturing a semiconductor device based on the electronic layout.

2. The method according to claim 1, wherein the selected 2D conductive element is a metal plate.

3. The method according to claim 1, wherein the selected 2D conductive element is a metal plate of a metal insulator metal (MIM) capacitor.

4. The method according to claim 1, wherein the selected 2D conductive element includes metal holes.

5. The method according to claim 1, wherein the plurality of polygons may comprise triangles or rectangles.

6. The method according to claim 1, wherein the wavelength is determined by dividing the speed of light by the maximum operating frequency.

7. The method according to claim 1, wherein the maximum operating frequency is 1K Hz or 1M Hz when the selected 2D conductive element is operated under a direct current (DC).

8. The method according to claim 1, further comprising:
determining an edge node on each edge of each of the plurality of polygons; and
determining an internal node within an internal area of each polygon.

9. The method according to claim 8, wherein the internal node of each of the plurality of polygons is located at a centroid of each polygon.

10. The method according to claim 8, wherein, for each of the plurality of polygons, the method further comprises:
determining the parasitic capacitance value of the polygon based on an area of the polygon, wherein the parasitic capacitance value of the polygon is at the internal node.

11. The method according to claim 8, wherein, for each of the plurality of polygons, the method further comprises:
partitioning the polygon into a plurality of triangles, each triangle formed by two adjacent vertices of the polygon and the internal node of the polygon, and each triangle including a resistor edge formed by the two adjacent vertices of the polygon; and
for each triangle, based on a length between the resistor edge and the internal node, determining a parasitic resistance value,
wherein the parasitic resistance value of each triangle is between the internal node and the corresponding edge node.

12. The method according to claim 11, wherein for each triangle, based on the length between the resistor edge and the internal node, determination of the parasitic resistance value further comprises:

for each triangle, partitioning the triangle into a plurality of rectangles, wherein the plurality of rectangles are arranged parallel to the corresponding resistor edge;

for each triangle, based on widths of the plurality of rectangles parallel to the resistor edge and lengths of the plurality of rectangles perpendicular to the widths, determining resistance values of the plurality of rectangles; and for each triangle, determining the parasitic resistance value based on resistance values of the plurality of rectangles.

13. A method, comprising:

receiving an electronic layout;

selecting a three-dimensional (3D) conductive element from the electronic layout;

partitioning the selected 3D conductive element into a plurality of polyhedrons;

determining multiple parasitic capacitance values for each of the plurality of polyhedrons;

determining multiple parasitic resistance values for each of the plurality of polyhedrons;

determining a total capacitance value of the selected 3D conductive element based on the parasitic capacitance values for each of the plurality of polyhedrons;

determining a total resistance value of the selected 3D conductive element based on the multiple parasitic resistance values for each of the plurality of polyhedrons; and manufacturing a semiconductor device based on the electronic layout.

14. The method according to claim 13, wherein, for each of the plurality of polyhedrons, the method further comprises determining one of the parasitic capacitance values based on an area of a face of the polyhedron.

15. The method according to claim 13, wherein, for each of the plurality of polyhedrons, the method further comprises:

partitioning the polyhedron into a plurality of tetrahedrons, each of the plurality of tetrahedrons formed by two adjacent edges of the polyhedron and a centroid node of the polyhedron, and each of the plurality of tetrahedrons including a resistor face formed by the two adjacent edges of the polyhedron; and for each of the plurality of tetrahedrons, based on a length between the resistor face and the centroid node, determining a parasitic resistance value.

16. The method according to claim 15, wherein for each of the plurality of tetrahedrons, based on the length between the resistor face and the centroid node, determination of the parasitic resistance value further comprises:

for each of the plurality of tetrahedrons, partitioning the tetrahedron into a plurality of cuboids, wherein the plurality of cuboids are stacked in a first direction orthogonal to the resistor face;

for each of the plurality of tetrahedrons, based on areas of the plurality of cuboids parallel to the resistor face and lengths of the plurality of cuboids in the first direction, determining resistance values of the plurality of cuboids; and for each of the plurality of tetrahedrons, determining the parasitic resistance value based on resistance values of the plurality of cuboids.

17. A non-transitory computer-readable medium having stored thereon program instructions that, upon execution by a processor, cause performance of a set of operations comprising:

receiving an electronic layout;

selecting a two-dimensional (2D) conductive element from the electronic layout, wherein a ratio of a width to a length of the selected 2D conductive element is lower than a predetermined threshold, the width is perpendicular to an electrical current direction of the selected 2D conductive element, and the length is parallel to the electrical current direction;

partitioning the selected 2D conductive element into a plurality of polygons, wherein a maximum length of each edge of the plurality of polygons is equal to or smaller than one tenth of a wavelength under a maximum operating frequency;

determining a parasitic capacitance value for each of the plurality of polygons;

determining multiple parasitic resistance values for each of the plurality of polygons;

determining a total capacitance value of the selected 2D conductive element based on the parasitic capacitance value for each of the plurality of polygons;

determining a total resistance value of the selected 2D conductive element based on the multiple parasitic resistance values for each of the plurality of polygons; and manufacturing a semiconductor device based on the electronic layout.

18. The non-transitory computer-readable medium according to claim 17, wherein, for each of the plurality of polygons, the set of operations further comprises determining the parasitic capacitance value of the polygon based on an area of the polygon.

19. The non-transitory computer-readable medium according to claim 17, wherein, for each of the plurality of polygons, the set of operations further comprises:

partitioning the polygon into a plurality of triangles, each triangle formed by two adjacent vertices of the polygon and a centroid node of the polygon, and each triangle including a resistor edge formed by the two adjacent vertices of the polygon; and for each triangle, based on a length between the resistor edge and the centroid node, determining a parasitic resistance value.

20. The non-transitory computer-readable medium according to claim 19, wherein for each triangle, based on the length between the resistor edge and the centroid node, determination of the parasitic resistance value further comprises:

for each triangle, partitioning the triangle into a plurality of rectangles, wherein the plurality of rectangles are arranged parallel to the resistor edge;

for each triangle, based on widths of the plurality of rectangles parallel to the resistor edge and lengths of the plurality of rectangles perpendicular to the widths, determining resistance values of the plurality of rectangles; and for each triangle, determining the parasitic resistance value based on resistance values of the plurality of rectangles.

* * * * *